United States Patent
Buono

(10) Patent No.: US 9,806,683 B2
(45) Date of Patent: Oct. 31, 2017

(54) AVERAGE CURRENT-MODE FEEDBACK CONTROL OF MULTI-CHANNEL CLASS-D AUDIO AMPLIFIER

(71) Applicant: Crestron Electronics, Inc., Rockleigh, NJ (US)

(72) Inventor: Robert Buono, Rockleigh, NJ (US)

(73) Assignee: Crestron Electronics, Inc., Rockleigh, NJ (US)

(*) Notice: Subject to any disclaimer, the term of this patent is extended or adjusted under 35 U.S.C. 154(b) by 0 days.

(21) Appl. No.: 15/185,637

(22) Filed: Jun. 17, 2016

(65) Prior Publication Data

US 2016/0373076 A1  Dec. 22, 2016

Related U.S. Application Data

(60) Provisional application No. 62/181,370, filed on Jun. 18, 2015.

(51) Int. Cl.
*H04R 3/02* (2006.01)
*H03F 3/183* (2006.01)
(Continued)

(52) U.S. Cl.
CPC ............ *H03F 3/2173* (2013.01); *H03F 1/34* (2013.01); *H03F 3/183* (2013.01); *H03F 3/68* (2013.01); *H04R 3/02* (2013.01); *H04R 3/04* (2013.01); *H03F 2200/03* (2013.01); *H03F 2200/351* (2013.01)

(58) Field of Classification Search
CPC ... H03F 1/34; H03F 3/183; H03F 3/68; H03F 3/217; H03F 3/2171; H03F 3/2173; H03F 3/2178; H03F 2200/03; H03F 2200/351; H04R 3/02; H04R 3/04; H04R 3/68; H04R 2430/01; H03G 1/0005; H03G 1/0088; H03G 1/0094; H03G 3/007; H03G 3/008; H03G 3/3026; H03G 3/3031

See application file for complete search history.

(56) References Cited

U.S. PATENT DOCUMENTS

| | | | |
|---|---|---|---|
| 6,259,317 B1* | 7/2001 | Melanson | H02M 7/5387 330/10 |
| 2012/0155676 A1* | 6/2012 | Feldstein | H04R 3/00 381/120 |
| 2012/0215216 A1* | 8/2012 | Friedrichs | A61B 18/1206 606/38 |

OTHER PUBLICATIONS

"Application Note: Average Current Mode Control of Switching Power Supplies," Dixon, L., 1999, Texas Instruments, Unitrode.
(Continued)

*Primary Examiner* — Mark Fischer
(74) *Attorney, Agent, or Firm* — Crestron Electronics, Inc.

(57) ABSTRACT

Described herein are several configurations of Class-D audio amplifiers, including a single-ended and a bridge-tied load (BTL) configuration, in which voltage-mode control and average current-mode control circuitry in feedback loops can be included to control the outputs of the Class-D amplifier to reduce open-loop errors and maintain a relatively high loop gain over an expected audio frequency range. The average current-mode control circuitry monitors current through a resistor common to both a current flow into a positive terminal of a loudspeaker associated with the amplifier and a current flow into a negative terminal of the loudspeaker. The voltage-mode control circuitry works with the average current-mode control circuitry in controlling the output of the Class-D audio amplifier.

22 Claims, 6 Drawing Sheets

(51) Int. Cl.
H03F 1/34 (2006.01)
H03F 3/217 (2006.01)
H04R 3/04 (2006.01)
H03F 3/68 (2006.01)

(56) References Cited

OTHER PUBLICATIONS

"Application Note: The UC3886 PWN Controller Uses Average Current Mode Control to Meet the Transient Regulation Performance of High End Processors," Spaziani, L, 1999, Texas Instruments.
"Application Note AN-1198: Bridging Class D Amplifiers," Ferstenberg, I, Jul. 17, 2013, International Rectifier, www.irf.com.
"A Multi-Loop Voltage-Feedback Filterless Class-D Switching Audio Amplifier using Unipolar Pulse Width Modulation," Oliva, A. R., et al., Feb. 2004, IEEE Transactions on Consumer Electronics, vol. 50, No. 1.
"Application Note 3977: Class D Amplifiers: Fundamentals of Operation and Recent Developments," Jan. 31, 2007, Maxim Integrated, http://www.maximintegrated.com/en/app-notes/index.mvp/id/3977.
"Multiple Windings Transformers," Storr, W., Mar. 12, 2015, Basic Electronics Tutorial, http://www.electronics-tutorials.ws/transformer/multiple-winding-transformer.html.

\* cited by examiner

AVERAGE CURRENT-MODE FEEDBACK CONTROL OF MULTI-CHANNEL CLASS-D AUDIO AMPLIFIER

PRIORITY INFORMATION

The present application claims priority under 35 U.S.C. §119(e) to U.S. Provisional Patent Application Ser. No. 62/181,370, filed 18 Jun. 2016, the entire contents of which are expressly incorporated herein by reference.

BACKGROUND

Technical Field

Aspects of the embodiments relate to use of current-mode feedback control of a multi-channel Class-D audio amplifier.

Background Art

Typically one of the last components in an audio distribution chain, audio amplifiers amplify a low power audio signal to a level suitable for driving one or more loudspeakers. Multi-channel audio amplifiers are employed throughout structures to amplify more than one channel of audio.

As known to those of skill in the art, typical Class-D audio amplifiers are a class of audio amplifier in which the audio signal modulates a pulse width modulated carrier signal to drive the output. Referring now to FIG. 1, a block diagram of class-D audio amplifier 100 is illustrated showing the different stages of operation of the audio amplifier. Input audio signal (input signal) 102 is input to pulse width modulator (PWM) comparator 104, which is part of modulator block 109, along with triangle wave 105 that has been generated by triangle wave generator 103. In PWM comparator 104, input signal 102 is compared to triangle wave 105. Triangle wave (or sawtooth wave) 105 is typically a much higher frequency signal than input signal 102—usually ten or more times the highest expected frequency of input signal 102. Thus, if an audio signal of about 20 Hz to about 20 kHz is expected as input signal 102, then triangle wave 105 should be at least about 200 kHz. As its name implies, PWM comparator 104 typically includes a comparator, and compares the amplitudes of input signal 102 to that of triangle wave 105 to form a pulse width modulated output. That is, the width of each pulse will be dependent upon the amplitude of both input signal 102 and the amplitude of triangle wave 105, but at a frequency equal to that of triangle wave 105. The duty cycle is proportional to the amplitude of input signal 102. If both input signal 102 and triangle wave 105 are centered about 0 volts, then for a 0 volt input signal 102, the output duty cycle is about 50%, and if input signal 102 is about $V_{tmax}$, the maximum of triangle waveform 105, the duty cycle is about 100%. If input signal 102 is about $V_{tmin}$, the lowest voltage value of triangle waveform 105, then the duty cycle is about 0%. FIG. 2 illustrates an example of a typical pulse width waveform generated in the above-described manner.

Referring now to FIG. 2, input signal 102 is shown as a roughly sinusoidal shaped signal with a frequency of about $\frac{1}{20}^{th}$ of that of triangle waveform 105. Comparator stage output 106 is shown below input signal 102 that is superimposed over triangle waveform 105; the logic level "high" represents the times in which the amplitude of input signal 102 exceeds that of triangle waveform 105. It can be seen that at points A and B, the duty cycle of comparator stage output 106 (the pulse width modulated signal) is about 50%, and as input signal 102 swings closer to $V_{tmax}$ (at point C) and $V_{tmin}$ (at point D), the duty cycle of comparator stage output 106 changes from about 100% to about 0%, respectively.

As known by those of skill in the art, typical Class-D audio amplifiers with multiple channels typically comprise a global triangle ramp generator for use in all of the channels. A global analog buffer and a local analog buffer can be inserted between each channel and the triangle ramp generator.

Following PWM comparator 104, comparator stage output 106 is input to switching output stage (or power stage) 108, which is also part of modulation block 109. This device is typically comprised of an arrangement of switching transistors configured as a "half-bridge" or "full-bridge" and it amplifies the signal input to it, to create switching output signal 110. As can be seen in FIG. 1, switching output signal 110 is an amplified version of comparator stage output 106, and switches between only two states, the positive and negative power supply rail voltages (in the case of the "half-bridge" implementation), and the positive power supply rail voltage and ground (in the case of the "full-bridge" implementation). As known to those of skill in the art, the gain of the typical Class-D audio amplifier modulator stage is set by the ratio of the power supply voltage, (or at least the power supply voltage that is available at switching output stage 108) and the peak-to-peak triangular wave voltage (triangle waveform 105). For example, the gain of the modulator stage, of a half-bridge implementation with +/−50V DC power supply rails, and a triangular wave voltage of 10 Vpp is 100V/10V=10.

Following switching output stage 108 is filter stage 112. In filtering stage 112, the amplified PWM signal is passed through an (ideally) lossless low pass filter (LPF) prior to the output device, speaker 116. The LPF removes the high frequency components of the PWM signal (switching output signal 110) and recovers the original audio signal, but in an amplified form, now referred to as amplified output signal 114.

Having briefly reviewed operation of a Class-D audio amplifier in a fairly general sense, attention can now be directed to specific design issues with regard to Class-D audio amplifiers. For example, it is known to those of skill in the art of power supplies to use current-mode control in buck-derived switch-mode power supplies. The principal benefits of current-mode control are the conversion of the double-pole passive inductor-capacitor (L-C) output filter of the Class-D audio amplifier topology into a single-pole output, greatly simplifying the task of feedback loop design, and achieving a stable control loop with adequate gain and phase margins. This feedback loop design task is especially difficult when the loop is closed at the output of the audio amplifier channel, after the L-C filter. However, it is after the L-C filter where the feedback loop must be closed, if state-of-the-art audio performance is desired. The goals of a state-of-the-art Class-D audio amplifier design involve achieving extremely low total harmonic distortion (THD) and noise levels, while maximizing dynamic range (signal-to-noise ratio (SNR)), frequency response, and flatness (at least over the expected frequency response). Additionally, for a Multi-Channel design, there is the requirement of minimizing channel-to-channel crosstalk. All of these design goals are aided by a feedback loop design utilizing negative feedback to reduce open loop errors. This feedback design needs to maintain a loop gain as high as possible over the audio frequency range (from about 20 Hz to about 20 KHz), and with as high a bandwidth as possible. This is made very difficult by the presence of the double-pole characteristic of the typical L-C output filter that is a part of most high-fidelity Class-D audio amplifier topologies. Current-mode control makes the design of this feedback loop more manageable, as described in greater detail below, as it simplifies the design of the feedback voltage amplifier. That is, a larger amount of passive components (such as resistors and capacitors) would be needed in the design of the feedback voltage amplifier. An additional characteristic, which is desirable for a multi-channel audio amplifier design, is the capability for two independent channels to be connected in a bridge-tied-load (BTL) configuration to drive a single speaker at up to four times the output power of a single channel.

As mentioned herein, the use of current-mode control is known to those of skill in the art of both switching power supplies and Class-D audio amplifiers. In the case of the latter, it is also known to those of skill in the art that current-mode control can be used as part of a double feedback loop system. However, many questions about such use remain unanswered, specifically, exactly how the current-mode control is implemented, whether peak current-mode control or average current-mode control is used, or how, and where, the current sensing signal is detected and processed. Further, there is no known knowledge or evidence from known usages of current-mode control in Class-D audio amplifiers about the suitability of the stated method of double-loop control in regard to multi-channel audio amplifier designs, in which it is desired to connect two independent channels in a BTL configuration.

Thus, there is a need for current-mode control of bridge tied load configurations of Class-D audio amplifiers in order to provide the benefits of both configurations in amplifying audio signals in a cost effective and efficient manner.

SUMMARY

It is to be understood that both the general and detailed descriptions that follow are explanatory only and are not restrictive of the embodiments.

The aspects of the embodiments described herein seek to overcome or at least ameliorate one or more of several problems, including but not limited to finding the ideal circuit location to sense current.

It is an object of the embodiments to substantially solve at least the problems and/or disadvantages discussed above, and to provide at least one or more of the advantages described below.

It is therefore a general aspect of the embodiments to provide systems, methods, and modes for current-mode feedback control of a multi-channel Class-D audio amplifier that will obviate or minimize problems of the type previously described.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

According to a first aspect of the embodiments, a class-D audio amplifier is provided, comprising: current-mode control circuitry in a feedback loop adapted to control an output voltage of the audio amplifier, wherein the current-mode control circuitry monitors current though a common resistor common to both a current flow into a positive terminal of a loudspeaker and a current flow into a negative terminal of the loudspeaker to control the output.

According to the first aspect of the embodiments, the current-mode control circuitry reduces open-loop errors, and maintains relatively high loop gain over an expected audio frequency range, and wherein the expected audio frequency range ranges from about 20 Hz to about 20,000 Hz.

According to the first aspect of the embodiments, the current-mode control circuitry comprises: a current averaging current-mode control circuitry, and further wherein the current-mode control circuitry comprises: an inner current loop, the inner current loop comprising: a current path that flows from a power converter transformer, through an inductor, through the loudspeaker, through the common resistor, and returns to a center tap of the power converter transformer.

According to the first aspect of the embodiments, the audio amplifier further comprises voltage-mode control circuitry in the feedback look adapted to control an output of the amplifier, and wherein the voltage-mode control circuitry reduces open-loop errors, and maintains relatively high loop gain over an expected audio frequency range, and further wherein the expected audio frequency range ranges from about 20 Hz to about 20,000 Hz.

According to the first aspect of the embodiments, the voltage-mode control circuitry comprises: a voltage amplifier adapted to compare a divided output voltage at a first input to an input voltage at a second input, and output an error signal, based on a difference between the divided output voltage and the input voltage.

According to the first aspect of the embodiments, the error signal comprises: a positive slewing voltage when the divided output voltage is less than the input voltage, and wherein the amplifier further comprises: a current amplifier with a first input connected to the output of the voltage amplifier, and a second input connected to a voltage generated by the inner current loop at the common resistor, and wherein when the output voltage of the voltage amplifier slews positive, the current amplifier is further adapted to cause its output to slew positive.

According to the first aspect of the embodiments, the audio amplifier further comprises: a pulse width modulator (PWM), with a first input connected to a triangle wave generator output, and a second input connected to the output of the current amplifier, and wherein when the voltage output of the current amplifier at the second input is greater than the triangle wave at the first input, the PWM is adapted to output a high voltage level signal, thereby increasing a duty cycle of the output of the PWM, which causes the output voltage of the audio amplifier to slew positive.

According to the first aspect of the embodiments, when the output voltage of the audio amplifier increases, the inner current loop through the common resistor increases, and the voltage generated at the common resistor and which is input to the current amplifier at the second input slews negative, which compensates and balances the positive drive from the output of the voltage amplifier, which is input to the first input of the current amplifier.

According to the first aspect of the embodiments, the class-D amplifier is a dual channel class-D amplifier, and wherein there is a first and a second inner current loop, a first and second feedback loop, a first and second voltage-mode control circuitry, a first and a second common resistor, a first and a second voltage amplifier, a first and a second current amplifier, and a first and a second pulse width modulator.

According to the first aspect of the embodiments, both the first and second voltage-mode control circuitry in respective feedback looks are adapted to control an output voltage of the amplifier, and wherein each of the first and second voltage amplifiers [340] are adapted to compare a divided output voltage at a first input to an input voltage at a second input, and output an error signal, based on a difference between the divided output voltage and the input voltage, and wherein the error signal comprises a positive slewing voltage when the divided output voltage is less than the input voltage.

According to the first aspect of the embodiments, the first and second current amplifiers each include a first input connected to the output of their respective voltage amplifiers, and a second input connected to a voltage generated by their respective inner current loops at their respective common resistors, and wherein when the output voltage of respective voltage amplifiers slews positive, the respective current amplifiers are further adapted to cause its output to slew positive.

According to the first aspect of the embodiments, the first and second pulse width modulators (PWMs) each include a first input connected to a respective triangle wave generator output, and a second input connected to the output of respective current amplifiers, and wherein when the voltage output of each of the first and second current amplifiers at the second input is greater than the triangle wave at the first input, the respective PWM is adapted to output a high voltage level signal, thereby increasing a duty cycle of the output of the respective PWM, which causes the output voltage of the audio amplifier to slew positive.

According to the first aspect of the embodiments, when the output voltage of the audio amplifier increases, the inner current loop through the first and second common resistor increases, and the voltage generated at the first and second common resistors and which is input to respective current amplifiers at the second input slews negative, which compensates and balances the positive drive from the output of the respective voltage amplifiers, which is input to the first input of the respective current amplifiers.

According to the first aspect of the embodiments, the class-D amplifier is a bridge-tied load class-D amplifier adapted from a combination of two independent single ended half-bridge amplifier circuits with a common input, and wherein each channel of a multi-channel amplifier are driven by galvanically isolated power supply positive and negative rails.

According to the first aspect of the embodiments, the galvanically isolated power supply positive and negative rails comprises: a single power converter transformer having multiple, substantially identical, secondary windings, each of which includes respective separate center taps.

According to the first aspect of the embodiments, the audio amplifier further comprises a single common connection formed at a junction of a first and second common resistor to a ground plane of a circuit board that contains the audio amplifier.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

BRIEF DESCRIPTION OF THE SEVERAL VIEWS OF THE DRAWING

Figure 1:
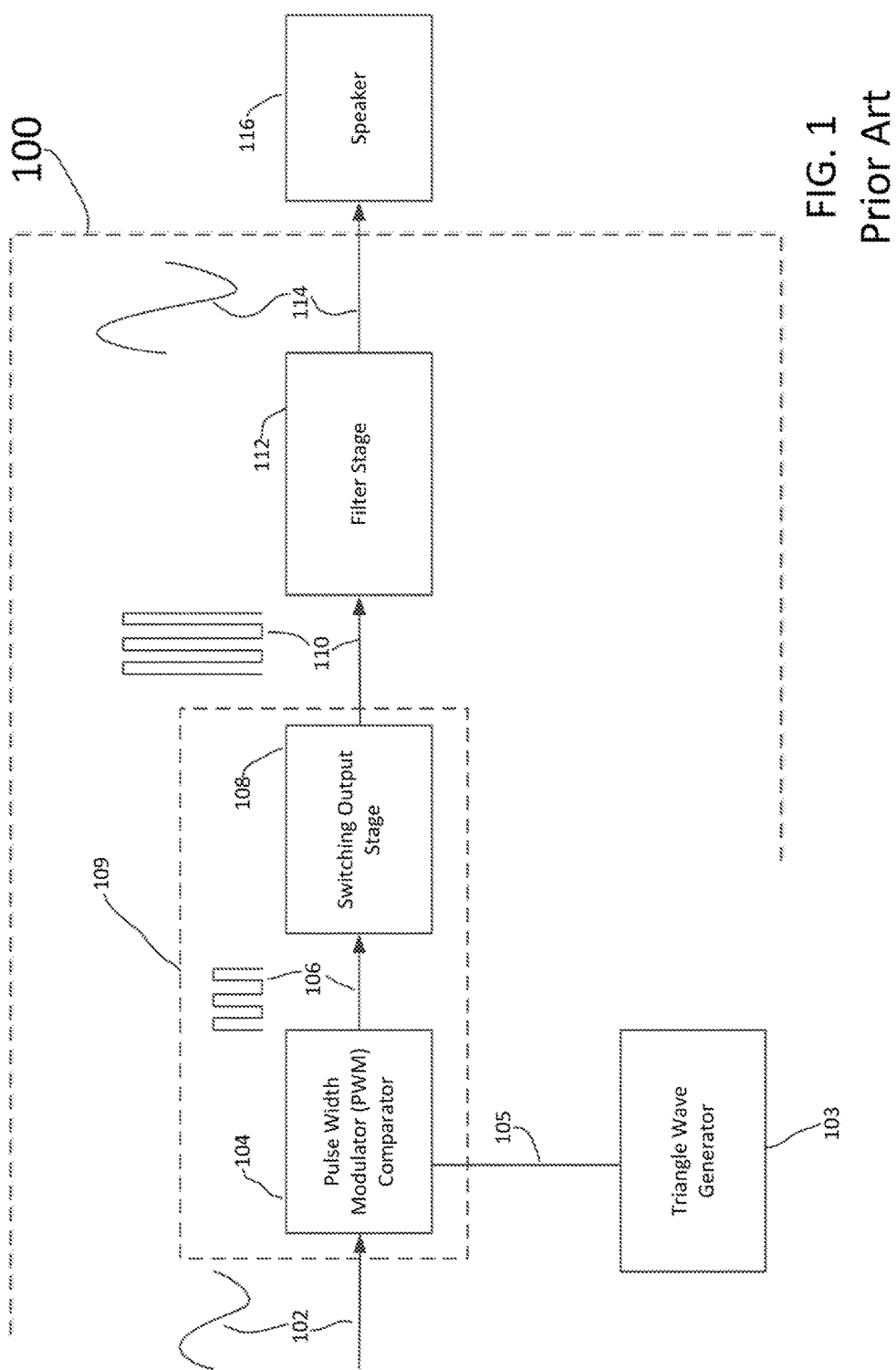

FIG. 1 is a block diagram of a Class-D audio amplifier.

Figure 2:
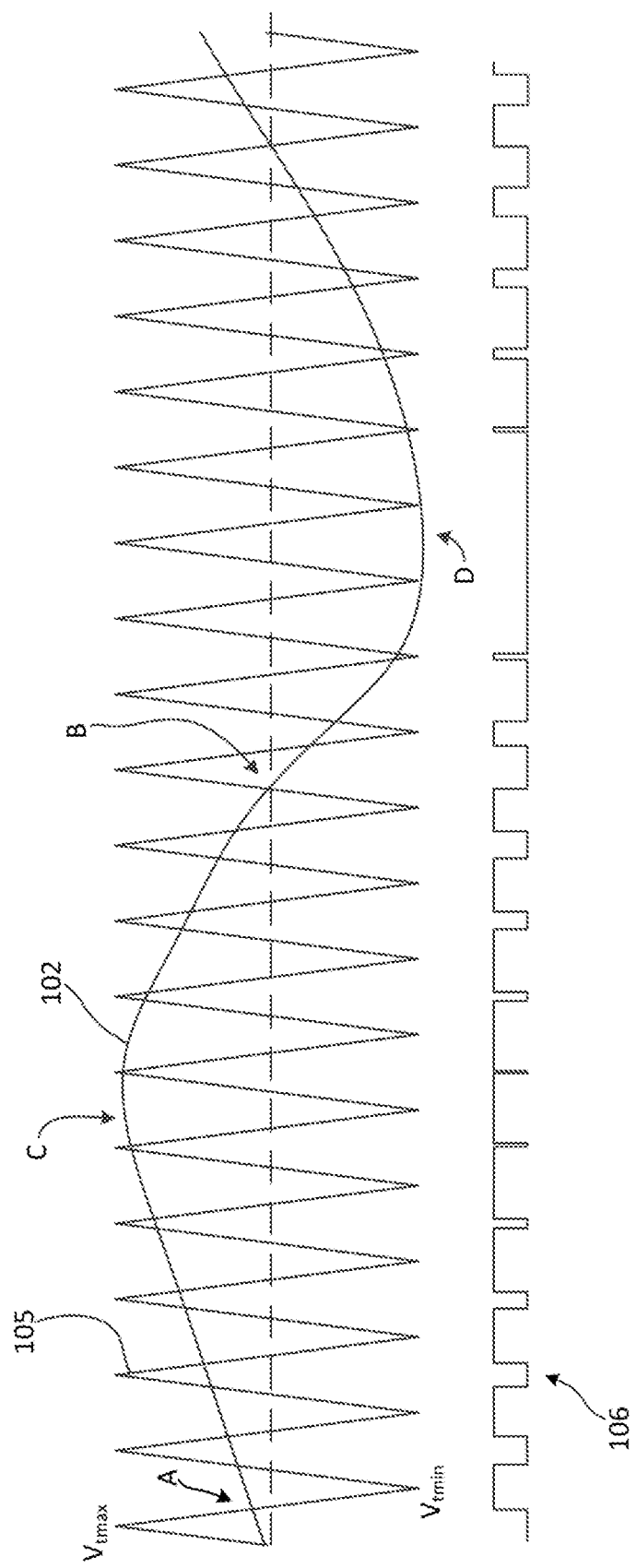

FIG. 2 illustrates a timing diagram of a triangle wave with an audio wave superimposed over it as inputs to a Class-D audio amplifier modulator, and a resultant output therefrom.

Figure 3:
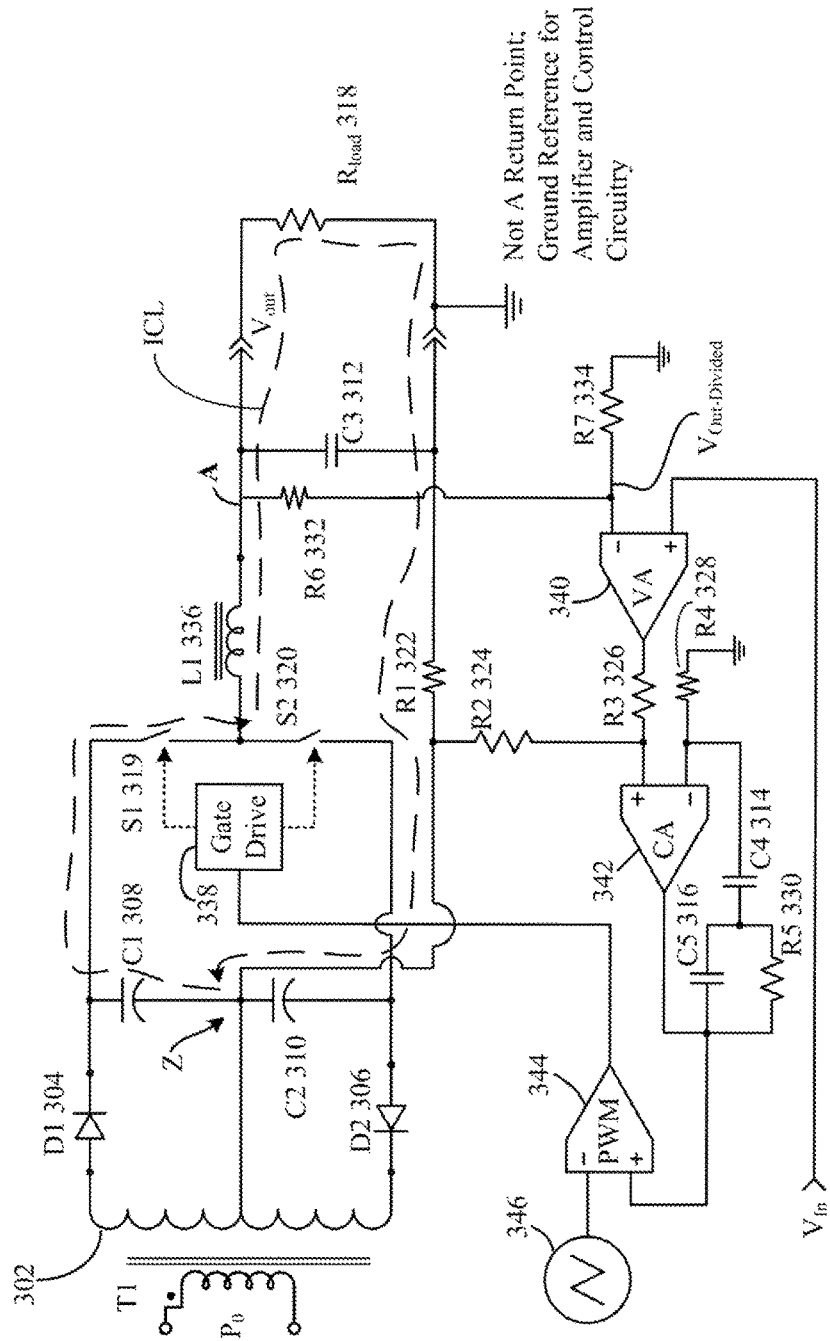

FIG. 3 is a circuit schematic that illustrates a portion of a Class-D audio amplifier with a current-mode feedback control circuit to monitor and control a loudspeaker according to aspects of the embodiments.

Figure 4:
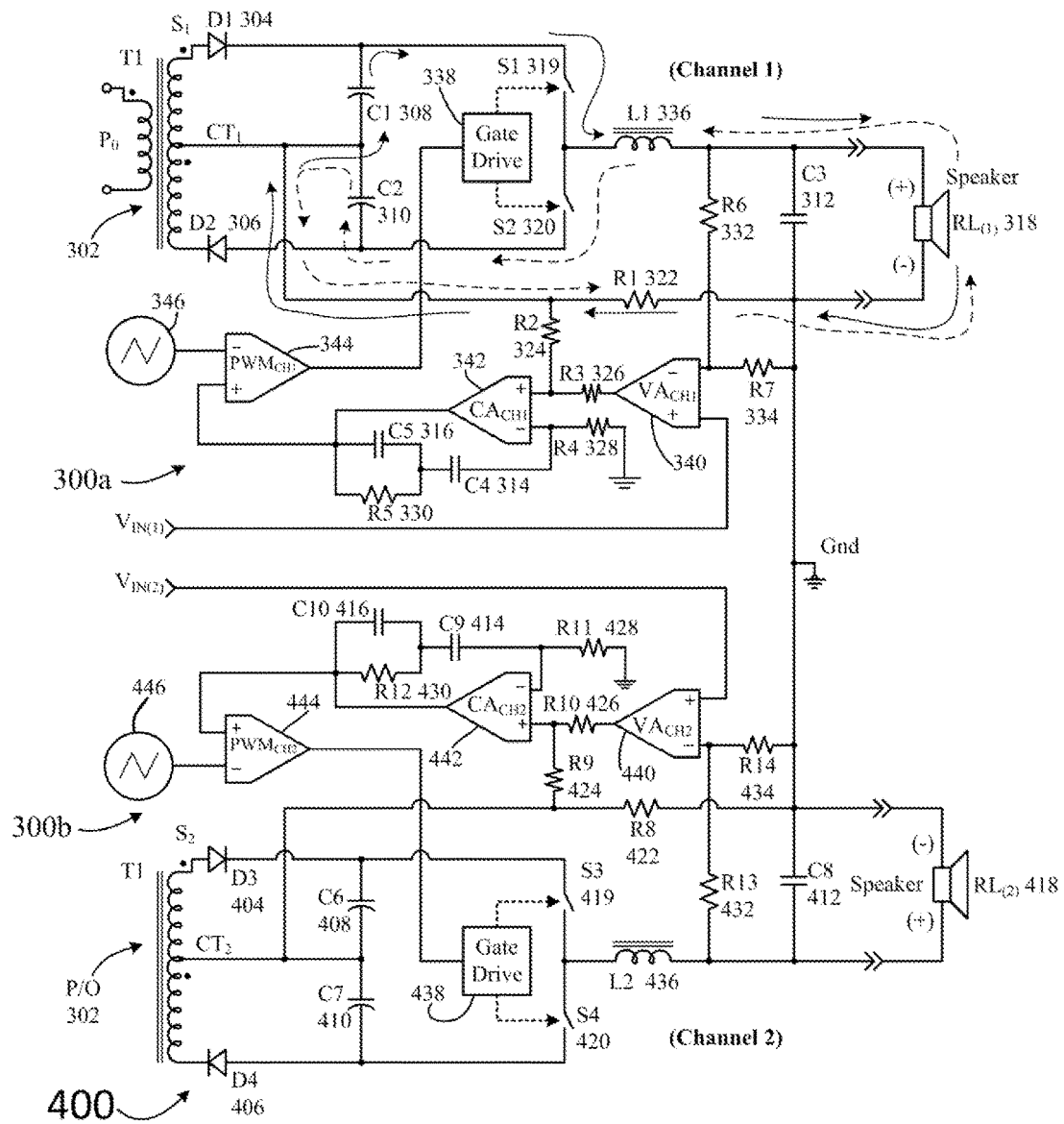

FIG. 4 is a circuit schematic that illustrates a plurality of current flow paths in a single channel of a dual channel Class-D audio amplifier with a current-mode feedback control circuit according to aspects of the embodiments.

Figure 5:
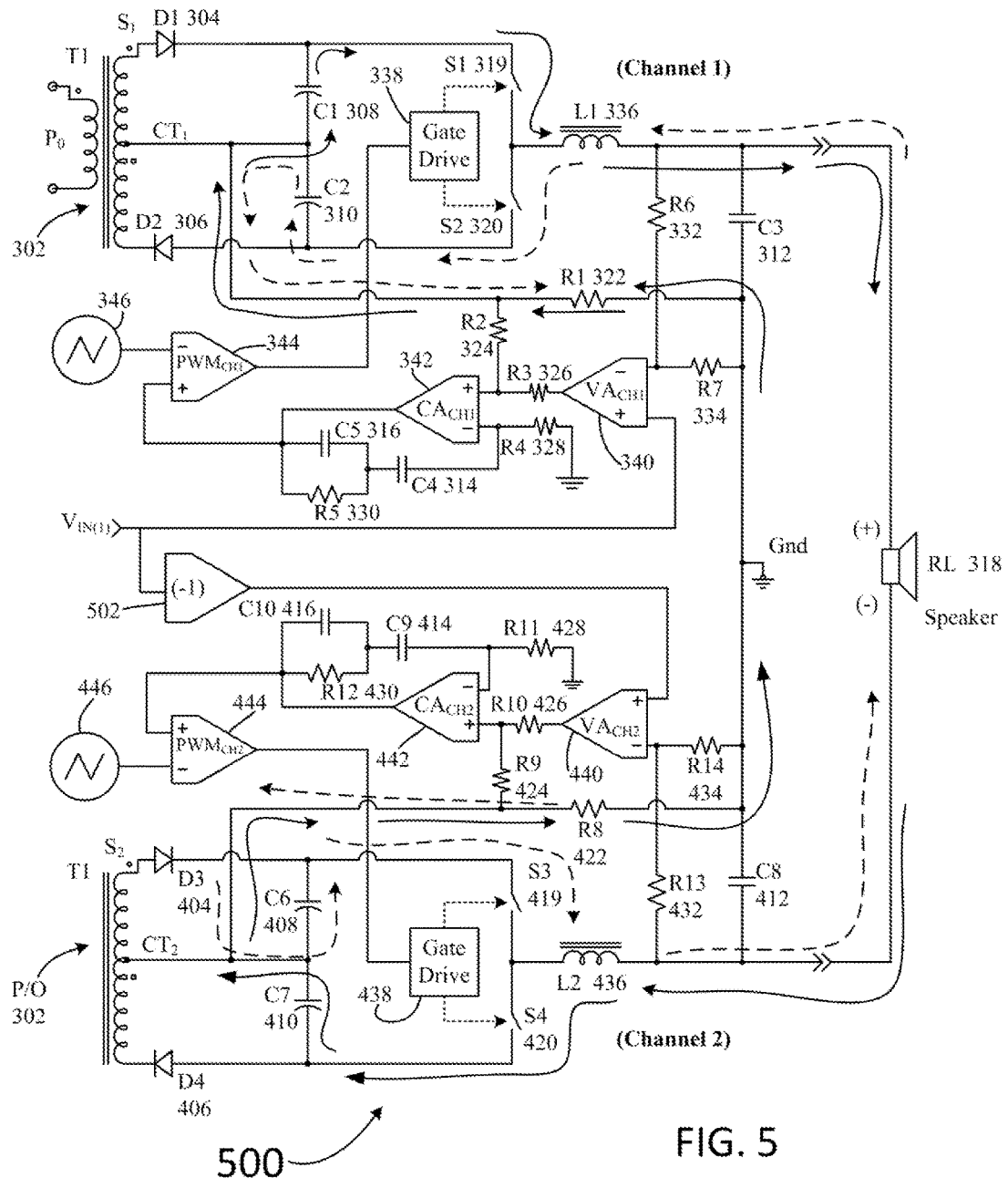

FIG. 5 is a circuit schematic that illustrates a plurality of current flow paths in a bridge-tied load Class-D audio amplifier adapted from two independent single-ended half-bridge circuits with a common input and a current-mode feedback control circuit according to aspects of the embodiments.

Figure 6:
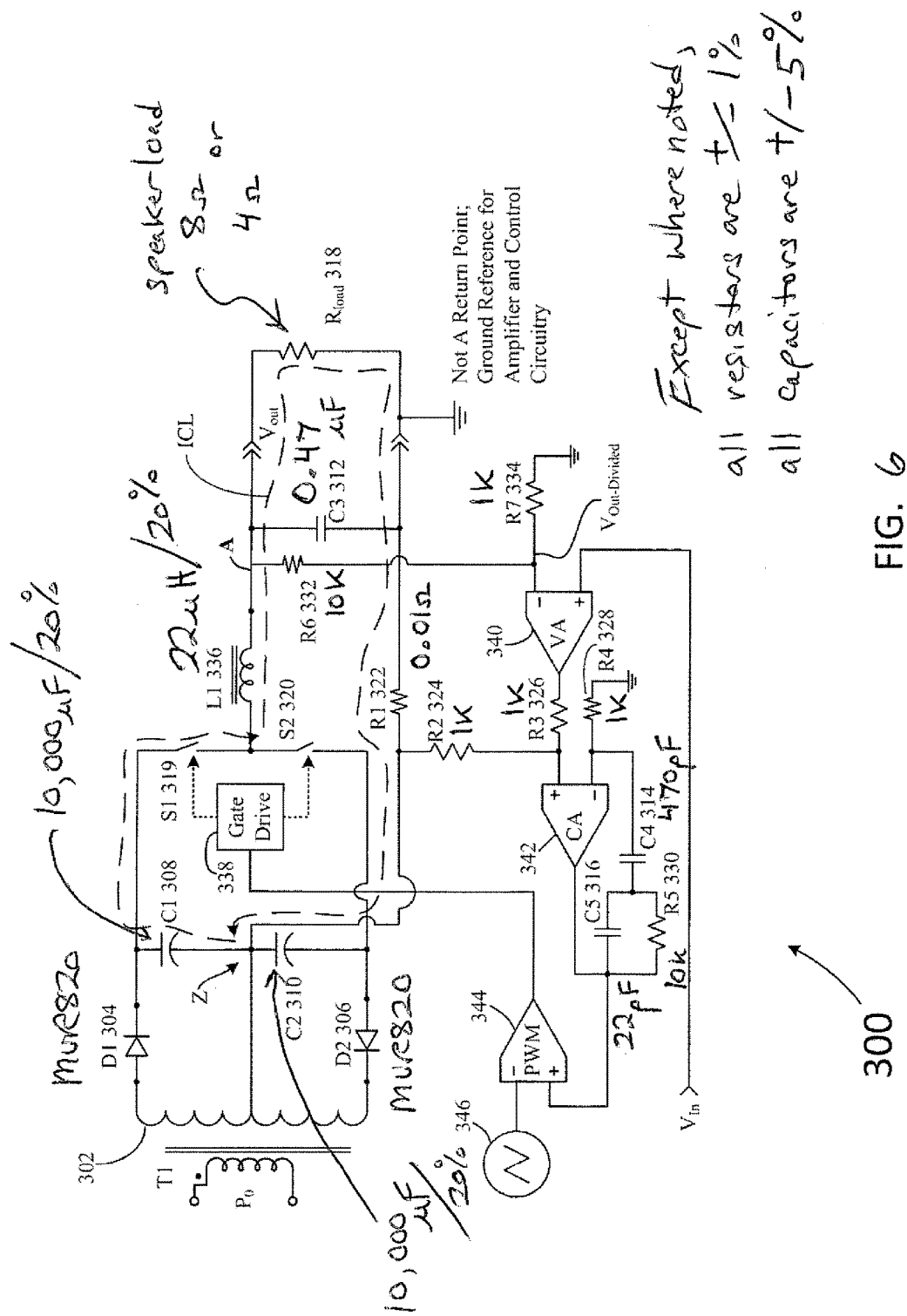

FIG. 6 illustrates the circuit of FIG. 3 with values for the discrete components according to aspects of the embodiments.

DETAILED DESCRIPTION OF THE INVENTION

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as media presentation products, which include such audio devices as Class-D amplifiers.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" or "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.
100 Typical Class-D audio amplifier
102 Input Signal
103 Triangle Wave Generator
104 Pulse Width Modulator (PWM) Comparator
105 Triangle Wave Generator Output
106 Comparator Stage Output
108 Switching Output Stage
109 Modulation Block
110 Switching Output Signal
112 Filter Stage
114 Amplified Output Signal
116 Speaker
300 Class-D Amplifier Circuit with Current-Mode Feedback Control (Class-D Amplifier)
302 Transformer
304 Diode D1
306 Diode D2
308 Capacitor C1
310 Capacitor C2
312 Capacitor C3
314 Capacitor C4
316 Capacitor C5
318 Resistor/Impedance $R_{Load}$
319 Switch S1
320 Switch S2
322 Resistor R1
324 Resistor R2
326 Resistor R3
328 Resistor R4
330 Resistor R5
332 Resistor R6
334 Resistor R7
336 Inductor L1
338 Gate Drive
340 Voltage Amplifier (VA)
342 Current Amplifier (CA)
344 Pulse Width Modulator (PWM)
346 Sawtooth Voltage Waveform Generator
400 Dual Channel Class-D Amplifier with Current-Mode Feedback Control (Dual Channel Audio Amplifier)
404 Diode D3
406 Diode D4
408 Capacitor C6
410 Capacitor C7
412 Capacitor C8
414 Capacitor C9
416 Capacitor C10
418 Resistor/Impedance $R_{Load}$
419 Switch S3
420 Switch S4
422 Resistor R8
424 Resistor R9
426 Resistor R10
428 Resistor R11
430 Resistor R12
432 Resistor R13
434 Resistor R14
436 Inductor L2
438 Gate Drive Channel 2
440 Voltage Amplifier (VA) Channel 2
442 Current Amplifier (CA) Channel 2
444 Pulse Width Modulator (PWM) Channel 2
446 Sawtooth Voltage Waveform Generator Channel 2
500 Bridge-Tied Load Class-D Amplifier Adapted from Two Independent Single Ended Half-Bridge Circuits (BTL Audio Amplifier)
502 Inverter

LIST OF ACRONYMS USED IN THE SPECIFICATION IN ALPHABETICAL ORDER

The following is a list of the acronyms used in the specification in alphabetical order.
BTL Bridge-Tied Load
C Capacitor
CA Current Amplifier
D Duty Cycle
ICL Inner Current Loop
kHz Kilohertz
L Inductor
LPF Low Pass Filter
PWM Pulse Width Modulator/Modulation
SE Single Ended
SNR Signal-to-Noise Ratio
THD Total Harmonic Distortion
VA Voltage Amplifier
$V_I$ Input Voltage
$V_O$ Output Voltage
$V_{PP}$ Voltage Peak-to-Peak

MODE(S) FOR CARRYING OUT THE INVENTION

The different aspects of the embodiments described herein pertain to the context of audio amplifiers, but is not limited thereto, except as may be set forth expressly in the appended claims.

Aspects of the embodiments implement current-mode feedback control in such a manner as to allow use of the bridge-tied-load (BTL) configuration in multi-channel Class-D audio amplifiers. At least one advantage in the use of current-mode feedback over voltage feedback is that it simplifies the design of the feedback voltage amplifier. That is, a higher amount of passive components (such as resistors and capacitors) would be needed in the design of the feedback voltage amplifier, as opposed to that of the current-mode feedback control system, described herein according to aspects of the embodiments.

According to an aspect of the embodiments, current-mode feedback control is added to a Class-D audio amplifier that uses a half-bridge topology. The single-ended (SE) half-bridge topology has the benefit of allowing two independent outputs (i.e., channels) of a multi-channel audio amplifier to be connected (externally, by the user) as a single, bridge-tied-load (BTL) output. This has the advantage of quadrupling the available output power to a given load impedance per speaker. According to the aspects of the embodiments, FIGS. 3-5 illustrate how to add current sensing in a circuit location such that it does not interfere with this BTL feature, yet still provides all the benefits of current-mode control. According to aspects of the embodiments, use of average current-mode feedback control provides the greatest design flexibility and the ability to work well with fixed-frequency designs.

The use of average current-mode control provides more design flexibility, according to aspects of the embodiments, because the inner current loop parameters, such as gain and bandwidth, are better controlled, which gives better audio performance in terms of THD and noise. In addition, average current-mode control further allows for a fixed frequency design, which while possible to do with peak current mode control, is substantially more complicated to implement in the latter case.

FIG. 3 is a circuit schematic that illustrates a portion of a Class-D audio amplifier with a current-mode feedback control circuit to monitor and control a loudspeaker output according to aspects of the embodiments. FIG. 3 illustrates portions of Class-D audio amplifier 300 with a current-mode control feedback circuit to monitor and control the loudspeaker output, $V_{out}$. FIG. 3 also illustrates the inner current loop (ICL) and outer voltage loop, comprising the total feedback loop, capable of delivering the performance goals of a state-of-the-art Class-D audio amplifier as described above. The inner current loop, shown in FIG. 3 as ICL as a dashed line, is formed by current flowing out of L1 336, through C3 312 and the load, which is loudspeaker RL 318 (note that although a current does flow through R6 332 and R7 334, because of the high input impedance of VA 340, this current is negligible in view of the current that flows through capacitor C3 312 and $R_{load}$ 318). The inner current returns to point Z through R1 322, and point Z is the center tap of transformer 302. A voltage drop forms across R1 322 and this is input to the inverting input of current amplifier (CA) 342 through R2 324.

The outer voltage loop of the circuit 300 of FIG. 3 comprises voltage amplifier (VA) 340; VA 340 senses the divided output voltage, $V_{Out\text{-}Divided}$, via voltage divider R6 332 and R7 334, and compares it to the input signal, $V_{in}$. A difference between these signals results in an error signal which then gets amplified by VA 340. A brief discussion of the principles of operation of the voltage and current control loops will now be provided.

According to a first condition, if $V_{out}$ is not positive enough ($V_{out}$ is input to the inverting input of VA 340 through resistors R6 332 and R7 334), i.e., is less positive than that of $V_{in}$ (the non-inverting input of VA 340), the output of VA 340 will slew positive. The output of VA 340 is input to CA 342, and the positive slewing input of CA 342 at the non-inverting input will cause the output of CA 342 to slew positive. The positive slewing output of CA 342 is then applied to the non-inverting input of PWM 344, which comprises, in part, a comparator. When the voltage at the non-inverting terminal of PWM 344 is greater than $V_{ref}$ (sawtooth voltage waveform 346), at the inverting terminal, $V_{out}$ of PWM 344 is high. When this occurs, the duty cycle of the output of PWM 344 increases. This causes $V_{out}$ to the speaker ($R_{Load}$ 318) to slew positive (see, FIG. 2). Note, also, that this example begins with $V_{out}$ being smaller than $V_{in}$. Now, through operation of the voltage and current control circuits, it is being forced in an opposite manner. A positive slewing $V_{out}$ causes a greater current flow through R1 322. As the current increases through R1 322, this causes the voltage at point Z to slew negative, and the voltage at the non-inverting input of CA 342 to slew negative, compensating and balancing the positive drive from the outputs of VA 340, thus compensating for the original error that drove the loop. Since CA 342 is an integrating or averaging amplifier (because of the capacitors in the feedback loop), it will have very high gain at low frequencies, and the accuracy of the feedback loop will be extremely good according to aspects of the embodiments (i.e., high open-loop gain).

FIG. 4 is a circuit schematic that illustrates a plurality of current flow paths in a first channel of a dual channel Class-D audio amplifier with a current-mode feedback control circuit according to aspects of the embodiments. FIG. 4 illustrates a plurality of current flow paths in a single channel of a dual channel Class-D audio amplifier constructed according to aspects of the embodiments. In FIG. 4, the current direction entering the "+" terminal of the speaker and exiting the "−" terminal of the speaker is represented by the solid arrows (denoted "positive terminal speaker current flow"), and the current direction entering the negative-terminal of the speaker and exiting the positive terminal of the speaker is represented by the dashed arrows (denoted "negative-terminal speaker current flow"). Note that both of the positive-terminal speaker current flow and the negative-terminal speaker current flow go through resistor R1 322. According to aspects of the embodiments, current sensing resistor R1 322 is at an optimal location to develop a current signal suitable for the control of the feedback loop as it is included in both of the current flow directions, as can be seen in FIG. 4. To reduce power losses in current sensing resistor R1 322, which would degrade power conversion efficiency, the resistor's voltage can be boosted by a suitable high frequency voltage operational amplifier (not shown in FIG. 4). One such VA is an LMH6639, manufactured by Texas Instruments, although others can also be used. Note that the configuration of each channel of dual channel amplifier 400 is substantially similar to that of amplifier 300 as shown in FIG. 3, and therefore operates in a substantially similar manner with respect to current-mode and voltage-mode control.

FIG. 5 is a circuit schematic that illustrates a plurality of current flow paths in a bridge-tied load (BTL) Class-D audio amplifier configured from two independent single-ended half-bridge circuits with a common input and a current-mode feedback control circuit (BTL audio amplifier 500) according to aspects of the embodiments. FIG. 5 illustrates a BTL Class-D audio amplifier configured from two independent single-ended half-bridge circuits with a common input according to an aspect of the embodiments. According to aspects of the embodiments, the configuration of FIG. 5 illustrates a dual channel Class-D amplifier, wherein the two channels are configured by a user in a BTL mode to drive a single speaker with two channels, thus driving the speaker at or about four times the power of a single channel driving a single speaker. Shown in FIG. 5 are a plurality of positive-terminal and negative-terminal current paths, similar to that as shown in FIG. 4. As with the embodiment illustrated in FIGS. 3 and 4, it can be seen that current sensing resistors R1 322 and R8 422 provide an optimal location for producing the desired current sensing signal. According to aspects of the embodiments, the optimal location is determined by the point in the current path that encompasses both a positive-terminal current flow and a negative-terminal current flow. In this manner, therefore, the feedback control loop can use average current-mode control to deliver the desired state-of-the-art characteristics of a Class-D audio amplifier, even when configured in BTL mode of operation. Note that the configuration of each channel of BTL audio amplifier 500 is substantially similar to that of amplifier 300 as shown in FIG. 3, and therefore operates in a substantially similar manner with respect to current-mode and voltage-mode control.

According to further aspects of the embodiments, one condition for successful implementation of the BTL mode of operation, as shown in FIG. 5, is that all channels of the multi-channel design be supplied by separate (e.g., galvanically isolated) power supply positive and negative rails. This can be readily accomplished by the use of a single power converter transformer (T1 302) having multiple, identical, secondary windings. Referring to both FIGS. 4 and 5, there is a single primary winding $P_0$, and multiple (in this case two) secondary windings, $S_1$ and $S_2$, which are separate not only from the primary winding $P_0$, but also from each other. Further, in each of the secondary windings $S_1$, $S_2$, there are respective center-taps, $CT_1$, $CT_2$. The sole common connection of the center-tap of said secondary windings is through the current sensing resistors of each channel (R1 322 and R8 422), to the common ground plane of the printed circuit board. All channels of the multi-channel audio amplifier share this same reference ground plane (GND; note, however, that this is not the same as the chassis or earth ground). Those skilled in the art of analog design, however, will recognize that having a common ground plane among multiple channels eases signal interfacing between those channels.

As those of skill in the art can appreciate, the values of the discrete components have been omitted from the drawing Figures; however, as those of skill in the art can no doubt appreciate, the exact values of the discrete components are not needed in order to understand and appreciate the aspects of the embodiments; thus, in fulfillment of the dual purposes of clarity and brevity, such values have been omitted from herein.

INDUSTRIAL APPLICABILITY

To solve the aforementioned problems, certain aspects of the embodiments are directed towards a Class-D audio amplifier arranged in a BTL configuration that uses an average current-mode feedback control circuit to control the output of the audio amplifier.

FIG. 6 illustrates the circuit of FIG. 3 with values for the discrete components according to aspects of the embodiments. As those of skill in the art can now appreciate, based on the discussion herein, the circuits of FIGS. 4 and 5 are substantially similar to the circuit of FIG. 3, albeit in different modes and configurations, as described above, and therefore the values and tolerances of similar discrete components in FIGS. 4 and 5 would also be substantially similar to the values and tolerances of the discrete components of FIG. 3. As such, the values and tolerances of similar discrete components in FIGS. 4 and 5 have not been repeated herein in fulfillment of the dual purposes of clarity and brevity.

The disclosed embodiments provide a system and method for controlling the output of a Class-D BTL audio amplifier, as well as single-ended Class-D audio amplifier configurations. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

Alternate Embodiments

Alternate embodiments may be devised without departing from the spirit or the scope of the different aspects of the embodiments.

What is claimed is:

1. A class-D audio amplifier, comprising:
current-mode control circuitry in a feedback loop adapted to control an output voltage of the audio amplifier, wherein
the current-mode control circuitry monitors current though a common resistor common to both a current flow into a positive terminal of a loudspeaker and a current flow into a negative terminal of the loudspeaker to control the output, and wherein the current-mode control circuitry comprises an inner current loop, the inner current loop comprising
a current path that flows from a power converter transformer, through an inductor, through the loudspeaker, through the common resistor, and returns to a center tap of the power converter transformer.

2. The audio amplifier according to claim 1, wherein the current-mode control circuitry reduces open-loop errors, and maintains relatively high loop gain over an expected audio frequency range.

3. The audio amplifier according to claim 2, wherein the expected audio frequency range ranges from about 20 Hz to about 20,000 Hz.

4. The audio amplifier according to claim 2, further comprising:
voltage-mode control circuitry in the feedback loop adapted to control an output of the amplifier.

5. The audio amplifier according to claim 4, wherein the voltage-mode control circuitry comprises:
a voltage amplifier adapted to compare a divided output voltage at a first input to an input voltage at a second input, and output an error signal, based on a difference between the divided output voltage and the input voltage.

6. The audio amplifier according to claim 5, wherein the error signal comprises:
a positive slewing voltage when the divided output voltage is less than the input voltage.

7. The audio amplifier according to claim 6, wherein the amplifier further comprises:

a current amplifier with a first input connected to the output of the voltage amplifier, and a second input connected to a voltage generated by the inner current loop at the common resistor, and wherein
when the output voltage of the voltage amplifier slews positive, the current amplifier is further adapted to cause its output to slew positive.

8. The audio amplifier according to claim 7, further comprising:
a pulse width modulator (PWM), with a first input connected to a triangle wave generator output, and a second input connected to the output of the current amplifier, and wherein
when the voltage output of the current amplifier at the second input is greater than the triangle wave at the first input, the PWM is adapted to output a high voltage level signal, thereby increasing a duty cycle of the output of the PWM, which causes the output voltage of the audio amplifier to slew positive.

9. The audio amplifier according to claim 8, wherein when the output voltage of the audio amplifier increases, the current in the inner current loop through the common resistor increases, and the voltage generated at the common resistor and which is input to the current amplifier at the second input slews negative, which compensates and balances the positive drive from the output of the voltage amplifier, which is input to the first input of the current amplifier.

10. The audio amplifier according to claim 9, wherein the class-D amplifier is a dual channel class-D amplifier.

11. The audio amplifier according to claim 10, wherein there is a first and a second inner current loop, a first and second feedback loop, a first and second voltage-mode control circuitry, a first and a second common resistor, a first and a second voltage amplifier, a first and a second current amplifier, and a first and a second PWM.

12. The audio amplifier according to claim 11, wherein both the first and second voltage-mode control circuitry in respective feedback loops are adapted to control an output voltage of the amplifier, and wherein
each of the first and second voltage amplifiers are adapted to compare a divided output voltage at a first input to an input voltage at a second input, and output an error signal, based on a difference between the divided output voltage and the input voltage, and wherein
the error signal comprises a positive slewing voltage when the divided output voltage is less than the input voltage.

13. The audio amplifier according to claim 12, wherein the first and second current amplifiers each include a first input connected to the output of their respective voltage amplifiers, and a second input connected to a voltage generated by their respective inner current loops at their respective common resistors, and wherein
when the output voltage of respective voltage amplifiers slews positive, the respective current amplifiers are further adapted to cause its output to slew positive.

14. The audio amplifier according to claim 13, wherein the first and second PWMs each include a first input connected to a respective triangle wave generator output, and a second input connected to the output of respective current amplifiers, and wherein
when the voltage output of each of the first and second current amplifiers at the second input is greater than the triangle wave at the first input, the respective PWM is adapted to output a high voltage level signal, thereby increasing a duty cycle of the output of the respective PWM, which causes the output voltage of the audio amplifier to slew positive.

15. The audio amplifier according to claim 14, wherein when the output voltage of the audio amplifier increases, the current in the inner current loop through the first and second common resistor increases, and the voltage generated at the first and second common resistors and which is input to respective current amplifiers at the second input slews negative, which compensates and balances the positive drive from the output of the respective voltage amplifiers, which is input to the first input of the respective current amplifiers.

16. The audio amplifier according to claim 4, wherein the voltage-mode control circuitry reduces open-loop errors, and maintains relatively high loop gain over an expected audio frequency range.

17. The audio amplifier according to claim 16, wherein the expected audio frequency range ranges from about 20 Hz to about 20,000 Hz.

18. The audio amplifier according to claim 1, wherein the current-mode control circuitry comprises:
a current averaging current-mode control circuitry.

19. The audio amplifier according to claim 1, wherein the class-D amplifier is a bridge-tied load class-D amplifier adapted from a combination of two independent single ended half-bridge amplifier circuits with a common input.

20. The audio amplifier according to claim 1, further comprising:
a multi-channel amplifier, and wherein each channel of the multi-channel amplifier is driven by galvanically-isolated power supply positive and negative rails.

21. The audio amplifier according to claim 20, wherein the galvanically isolated power supply positive and negative rails comprises:
a single power converter transformer having multiple, substantially identical, secondary windings, each of which includes respective separate center taps.

22. The audio amplifier according to claim 21, further comprising:
a single common connection formed at a junction of a first and second common resistor to a ground plane of a circuit board that contains the audio amplifier.

* * * * *